US011516597B2

(12) United States Patent
Nawaz et al.

(10) Patent No.: US 11,516,597 B2
(45) Date of Patent: Nov. 29, 2022

(54) FORCE FEEDBACK ACTUATOR FOR A MEMS TRANSDUCER

(71) Applicant: Knowles Electronics, LLC, Itasca, IL (US)

(72) Inventors: Mohsin Nawaz, Lombard, IL (US); Stephen C. Thompson, State College, PA (US); Michael Pedersen, Long Grove, IL (US); Peter V. Loeppert, Durand, IL (US); Zouhair Sbiaa, Schaumburg, IL (US)

(73) Assignee: Knowles Electronics, LLC, Itasca, IL (US)

( * ) Notice: Subject to any disclaimer, the term of this patent is extended or adjusted under 35 U.S.C. 154(b) by 47 days.

(21) Appl. No.: 17/117,073

(22) Filed: Dec. 9, 2020

(65) Prior Publication Data

US 2021/0176569 A1 Jun. 10, 2021

Related U.S. Application Data

(60) Provisional application No. 62/946,348, filed on Dec. 10, 2019.

(51) Int. Cl.
*H04R 19/00* (2006.01)
*H04R 19/04* (2006.01)
(Continued)

(52) U.S. Cl.
CPC .......... *H04R 19/04* (2013.01); *B81B 3/0056* (2013.01); *H04R 1/04* (2013.01);
(Continued)

(58) Field of Classification Search
CPC .... H04R 19/04; H04R 1/04; H04R 2201/003; H04R 1/10; H04R 25/00; H04R 31/00; H04R 19/005; B81B 3/0056; B81B 2201/0257; B81B 2201/033; B81B 2203/0127; B81B 2203/0136; B81B 2203/04; B81B 3/0021; G01L 23/125; H02N 1/006
See application file for complete search history.

(56) References Cited

U.S. PATENT DOCUMENTS 7,545,945 B2 * 6/2009 Miles ................ H04R 19/04
                                                  381/174
9,402,137 B2 * 7/2016 Hsu ................... H04R 19/005
(Continued)

FOREIGN PATENT DOCUMENTS

DE  102009028924  3/2011
DE  102017212613  7/2017
(Continued)

*Primary Examiner* — Matthew A Eason
(74) *Attorney, Agent, or Firm* — Loppnow & Chapa; Matthew C. Loppnow (57) ABSTRACT

A force feedback actuator includes a pair of electrodes and a dielectric member. The pair of electrodes are spaced apart from one another to form a gap. The dielectric member is disposed at least partially within the gap. The dielectric member includes a first portion having a first permittivity and a second portion having a second permittivity that is different from the first permittivity. The dielectric member and the pair of electrodes are configured for movement relative to each other.

21 Claims, 10 Drawing Sheets

(51) Int. Cl.
 *B81B 3/00* (2006.01)
 *H04R 1/04* (2006.01)
(52) U.S. Cl.
 CPC . *B81B 2201/0257* (2013.01); *B81B 2201/033* (2013.01); *B81B 2203/0127* (2013.01); *B81B 2203/0136* (2013.01); *B81B 2203/04* (2013.01); *H04R 2201/003* (2013.01)

(56) References Cited

U.S. PATENT DOCUMENTS

| | | | | |
|---|---|---|---|---|
| 9,611,135 | B1* | 4/2017 | Klein | H02N 2/02 |
| 9,728,653 | B2* | 8/2017 | Dehe | H01L 29/84 |
| 10,244,330 | B2* | 3/2019 | Wu | H04R 19/04 |
| 11,387,748 | B2* | 7/2022 | Hsu | H02N 1/008 |
| 2005/0139577 | A1* | 6/2005 | Kim | H02N 1/008 |
| | | | | 216/41 |
| 2014/0105428 | A1* | 4/2014 | Zoellin | H04R 23/00 |
| | | | | 381/174 |
| 2014/0109680 | A1* | 4/2014 | Tsai | G01L 9/0072 |
| | | | | 73/702 |
| 2014/0152325 | A1* | 6/2014 | Narita | B81B 3/0086 |
| | | | | 324/662 |
| 2014/0197502 | A1* | 7/2014 | Dehe | B81C 1/0015 |
| | | | | 257/416 |
| 2015/0110309 | A1* | 4/2015 | Park | B81B 3/0086 |
| | | | | 381/190 |
| 2016/0066099 | A1* | 3/2016 | Dehe | H04R 31/00 |
| | | | | 381/174 |
| 2018/0091906 | A1* | 3/2018 | Khenkin | H04R 19/04 |
| 2018/0194615 | A1* | 7/2018 | Nawaz | B81B 7/0032 |
| 2019/0058936 | A1* | 2/2019 | Dehe | H04R 31/003 |
| 2021/0176569 | A1* | 6/2021 | Nawaz | H04R 31/00 |
| 2021/0185448 | A1* | 6/2021 | Kim | H04R 31/00 |
| 2021/0340006 | A1* | 11/2021 | Loeppert | H04R 1/32 |
| 2022/0042852 | A1* | 2/2022 | Dehé | G01J 3/108 |

FOREIGN PATENT DOCUMENTS

| | | |
|---|---|---|
| JP | 2001050704 | 2/2001 |
| WO | 2019183283 | 9/2019 |

* cited by examiner

FORCE FEEDBACK ACTUATOR FOR A MEMS TRANSDUCER

CROSS-REFERENCE TO RELATED APPLICATIONS

The present application claims the priority benefit of U.S. Provisional Patent Application No. 62/946,348, filed Dec. 10, 2019, which is incorporated herein by reference.

BACKGROUND

Microphones are deployed in various types of devices such as personal computers, cellular phones, mobile devices, headsets, headphones, and hearing aid devices. However, as the devices get smaller, they require smaller microphones. Smaller microphones suffer from higher acoustic noise caused by air flow and thermal losses within the device and often have lower signal-to-noise ratios than larger microphones.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

Performance losses in microphones and particularly in microelectromechanical systems (MEMS) microphones occur due to viscous losses from resistance to airflow within the device. The viscous losses limit the signal to noise ratio (SNR) of the microphone. To improve SNR, the microphone may be encapsulated and placed under reduced pressure (e.g., near vacuum). Once encapsulated, a sensing diaphragm of the microphone experiences loads associated with fluctuations in atmospheric pressure. In some implementations, a force feedback actuator may be used to compensate for these sensed fluctuations in atmospheric pressure. The force feedback actuator includes a dielectric comb structure or grid engaged with an array of conductive pins. The dielectric grid has two functions. The first function is to operate as an actuator to provide force feedback to the pressure diaphragm in order to offset the opposing force created by atmospheric pressure. When a voltage is applied to the adjacent pins, a force is created on the dielectric grid, pulling the dielectric grid parallel to the pins, further engaging the pins, thus increasing the capacitance between the pins. The second function of the dielectric grid is as a sensor. The low frequency portion of the sensed signal provides a way to adjust the force feedback voltage to compensate for atmospheric pressure changes while the high frequency portion of the sensed signal represents the desired acoustic signal. Examples of force feedback actuator designs are provided in U.S. Pat. No. 62/769,468, filed Nov. 19, 2018, U.S. Patent Application No. 62/773,989, filed Nov. 30, 2018, and PCT/US2019/023260, filed Mar. 20, 2019, all of which are hereby incorporated by reference herein in their entireties.

The dielectric grid is disposed in a gap formed between adjacent pins and is configured to move relative to the pins in response to acoustic activities and changes in atmospheric pressure. It has been found that variations in the material properties of the dielectric grid, along the direction of movement between the grid and the pins, affects the performance of the force feedback actuator. In particular, these changes in material properties can cause instability due to gradients in the electrostatic force as the grid moves relative to the pins.

The present disclosure provides an improved dielectric grid for a force feedback actuator. The dielectric grid is structured to improve sensitivity of the force feedback actuator and increase the overall range of operation by controlling the size and the position of voids that are formed into individual dielectric members of the dielectric grid during the fabrication process. It has been found that the size and position of these voids directly impacts the gradients of electrostatic force (e.g., changes in electrostatic force with the relative position of the dielectric grid with respect to the pins) that are encountered during operation.

Figure 1:
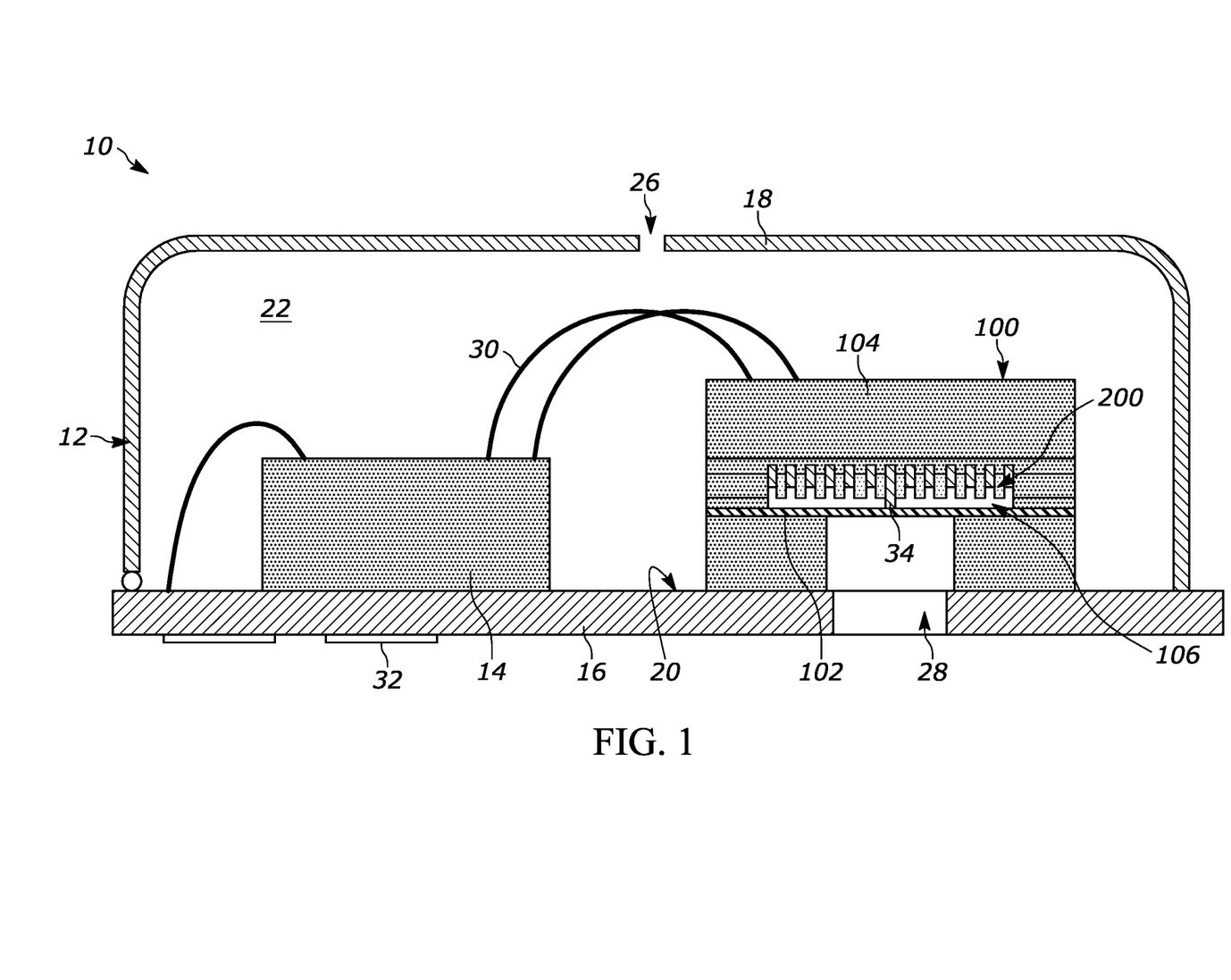
FIG. 1 is a side cross-sectional view of an example microphone assembly.

As shown in FIG. 1, one implementation relates to a microphone assembly 10. The microphone assembly 10 includes a housing 12, a MEMS transducer 100, and an integrated circuit (IC) 14. The housing 12 includes a substrate 16 and a cover 18 coupled to an upper surface 20 of the substrate 16. The cover 18 is secured to the substrate 16 along a perimeter of the cover 18. Together, the cover 18 and the substrate 16 define an interior portion 22 (e.g., hollow cavity, etc.). The cover 18 may include an atmospheric equalization vent 26 (e.g., opening, hole, etc.) that provides fluid communication between an environment surrounding the housing 12 and the interior portion 22. The atmospheric equalization vent 26 prevents damage to the housing 12 and/or other components of the microphone assembly 10 that might otherwise occur due to extreme temperature and/or pressure fluctuations in the environment surrounding the microphone assembly 10. The MEMS transducer 100 and the IC 14 are positioned within the interior portion 22 and are coupled to the upper surface 20.

The substrate 16 includes a sound port 28 that is aligned with the MEMS transducer 100 such that the MEMS transducer 100 is exposed to pressure changes through the sound port 28. The relative position between the MEMS transducer 100 and the sound port 28 may differ in various illustrative embodiments. For example, the sound port 28 may be formed into the cover 18 rather than the substrate 16 and the MEMS transducer 100 may be adjacent to the sound port 28. In these cases, the MEMS transducer 100 may be inverted from that shown in FIG. 1. The MEMS transducer 100 generates electrical signals based on pressure changes communicated to the MEMS transducer 100 through the sound port 28. The pressure changes may be changes in the ambient atmospheric pressure (e.g., a pressure of the environment surrounding the microphone assembly 10) and/or pressure changes caused by an acoustic stimulus such as sound. The IC 14 is coupled to the MEMS transducer 100 and is configured to interpret electrical signals produced by the MEMS transducer 100. As shown in FIG. 1, the IC 14 is hardwired to the MEMS transducer 100 using leads and traces 30 to form an electrical connection between the MEMS transducer 100 and the IC 14. The IC 14 is also electrically connected to the substrate 16 and to pads 32 for communication with the device to which the microphone assembly 10 is connected (e.g., a personal computer, a cellular phone, a mobile device, a headset, a headphone device, a hearing aid device, etc.). In some implementations, the IC 14 includes acoustic signal and atmospheric signal processing circuitry and/or software to interpret the electrical signal from the MEMS transducer 100.

MEMS transducer 100 is configured to sense acoustic activity and changes in atmospheric pressure. The MEMS transducer 100 includes pressure diaphragm 102 and a force feedback actuator 200 (e.g., a dielectric actuator, a comb actuator, etc.) that is coupled to the pressure diaphragm 102. As shown in FIG. 1, the pressure diaphragm 102 is in fluid communication with the sound port 28 and is configured to transmit pressure fluctuations to the force feedback actuator 200. Specifically, the pressure diaphragm 102 is configured to transmit pressure fluctuations through a rigid support 34 (e.g., protrusion) that extends between the pressure diaphragm 102 and the force feedback actuator 200.

As shown in FIG. 1, at least a portion of the force feedback actuator 200 is sealed from an environment surrounding the microphone assembly 10 (e.g., the sound port 28 and the interior portion 22). Specifically, at least a portion of the force feedback actuator 200 is disposed within an enclosed chamber 106 formed between the first transducer substrate 104 and the pressure diaphragm 102. The enclosed chamber 106 is sealed at a low pressure near vacuum. In some implementations, the enclosed chamber 106 has a pressure that is less than or substantially equal to 30 Pa. In some implementations, the enclosed chamber 106 has a pressure that is less than or substantially equal to 10 Pa. As shown in FIG. 1, a lower surface of the pressure diaphragm 102 is in fluid communication with the environment surrounding the microphone (e.g., the sound port 28), outside of the enclosed chamber 106.

Figure 2:
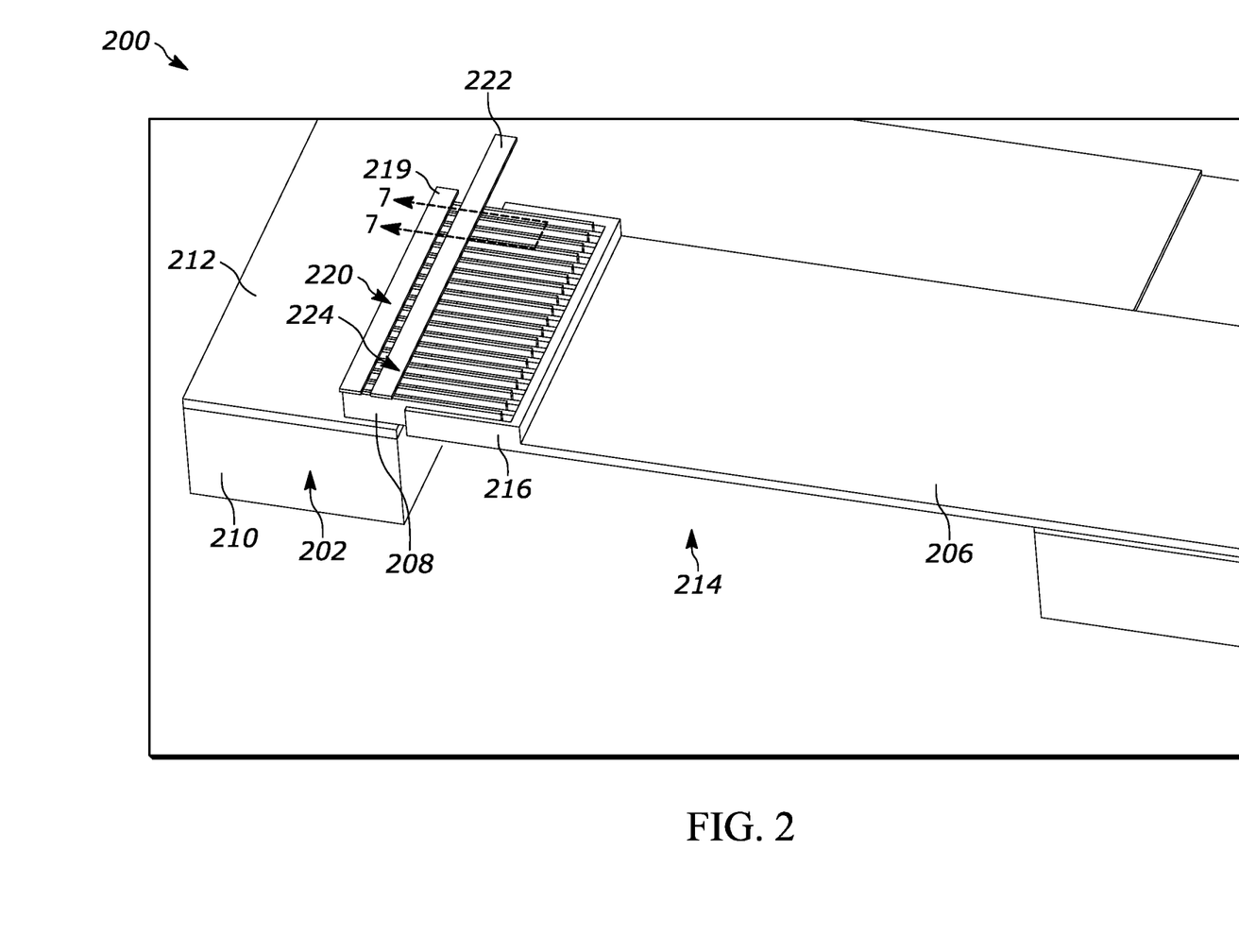
FIG. 2 is perspective cross-sectional view of an example microelectromechanical systems (MEMS) transducer.

FIG. 2 shows a perspective view of the force feedback actuator 200 of FIG. 1. The force feedback actuator 200 includes a support structure 202, a cantilever diaphragm 206, and a plurality of stationary fingers 208. The support structure 202 is coupled to the cantilever diaphragm 206 and the stationary fingers 208 and is configured to support the cantilever diaphragm 206 in position with respect to the stationary fingers 208. As shown in FIG. 1, the support structure 202 is "sandwiched" or otherwise disposed between the first transducer substrate 104 and the pressure diaphragm 102. As shown in FIG. 2, the support structure 202 includes a base 210 (e.g., silicon wafer) and an insulator layer 212 deposited on an upper surface of the base 210. The base 210 defines a central opening 214 extending therethrough from the upper surface to the lower surface of the base 210. Suitable materials for insulator layer 212 include silicon dioxide, silicon nitride, and silicon oxynitride.

The cantilever diaphragm 206 is coupled to an upper surface of the insulator layer 212 and extends over the central opening 214 such that the cantilever diaphragm 206 substantially covers the central opening 214. A first end of the cantilever diaphragm 206 is coupled to the insulator layer 212, while a second end (e.g., unsupported end) is disposed over the central opening 214 proximate to an inner perimeter of the base 210. The cantilever diaphragm 206 is structured to move in a direction parallel to the central axis of the base 210 (e.g., up and down as shown in FIG. 2) in response to an input force from the pressure diaphragm 102 (e.g., from the from the rigid support 34 extending between the pressure diaphragm 102 shown in FIG. 1 and the cantilever diaphragm 206 shown in FIG. 2). As shown in FIG. 2, the cantilever diaphragm 206 includes a plurality of movable fingers 216 disposed at the second end. The movable fingers 216 form a plurality of rectangular shaped fins arranged in a substantially parallel orientation with respect to one another. In other embodiments, the shape of the moveable fingers 216 may be different.

As shown in FIG. 2, the stationary fingers 208 are coupled to the upper surface of the insulator layer 212 on an opposite end of the base 210 as the first end of the cantilever diaphragm 206. The stationary fingers 208 are arranged in substantially parallel orientation with respect to one another across an upper edge of the central opening 214. The stationary fingers 208 are spaced apart from one another to form a plurality of channels or gaps configured to receive the movable fingers 216 of the cantilever diaphragm 206 therein. In other words, the movable fingers 216 are interposed between the stationary fingers 208 such that each one of the stationary fingers 208 is surrounded on at least two sides by the movable fingers 216.

The movable fingers 216 are configured to move relative to the stationary fingers 208 to generate an electrical signal in response to pressure fluctuations incident on the MEMS transducer 100 (e.g., the pressure diaphragm 102 as described with reference to FIG. 1). In the implementation shown in FIG. 2, the stationary fingers 208 are pins or conductors arranged in two interleaved groups that are electrically isolated from one another. The conductors may be made from a polycrystalline silicon material or another suitable conductor. A first group of conductors is electrically connected to one another by a first metal interconnect 219 (e.g., a polycrystalline silicon material or another suitable conductor) that extends across an upper surface of the first group of conductors to form a first electrode 220. A second group of conductors is electrically connected to one another by a second metal interconnect 222 that extends across an upper surface of the second group of conductors to form a second electrode 224.

The movable fingers 216 form the dielectric grid for the force feedback actuator 200. Each of the moveable fingers 216 is made from a dielectric material such as silicon nitride. In operation, when the cantilever diaphragm 206 moves under an acoustic pressure, the movable fingers 216 (e.g., the dielectric members) move up and down within the gaps between adjacent conductors. A bias voltage is applied between the first electrode 220 and the second electrode 224 and an electrical signal is extracted based on the measured change in voltage due to the position of the movable fingers 216. The applied bias voltage generates an electrostatic field between the first electrode 220 and the second electrode 224, which provides a restorative electrostatic force that counteracts relative movement between the dielectric member and the electrodes (e.g., that counteracts the mechanical force imparted to the cantilever diaphragm 206 by the pressure diaphragm 102). Among other benefits, separating the first electrode 220 from the second electrode 224 by a dielectric material significantly reduces the lateral force acting to collapse the electrodes toward one another. The reduction in the lateral force between electrodes reduces the restrictions associated with the geometry of the fingers that can be used for the force feedback actuator 200 (e.g., the width/thickness of the fingers, the length of the fingers extending over the central opening 214, etc.), which in turn allows the geometry to be optimized to produce a higher output signal as compared to other constructions.

The design of the force feedback actuator 200 described with reference to FIG. 2 should not be considered limiting. Many variations are possible without departing from the inventive concepts disclosed herein. For example, in some implementations, the materials used for the stationary fingers 208 and the movable fingers 216 may be reversed such that the electrodes move relative to a stationary dielectric material (e.g., such that the movable fingers 216 are made from a conductive material and the stationary fingers 208 are made from an insulating material). In some embodiments, the cantilever diaphragm 206 and the movable fingers 216 may be integrally formed as a single unitary structure. In other embodiments, the movable fingers 216 may be made from a different material that is deposited on or otherwise coupled to the second end of the cantilever diaphragm 206. In an implementation where the movable fingers 216 are used as the electrodes, the metal interconnects 219, 222 may be arranged along an upper surface of the movable fingers 216. The exact positioning of the metal interconnects 219, 222 relative to either the stationary fingers 208 or the movable fingers 216 may also differ in various illustrative embodiments.

Figure 3:
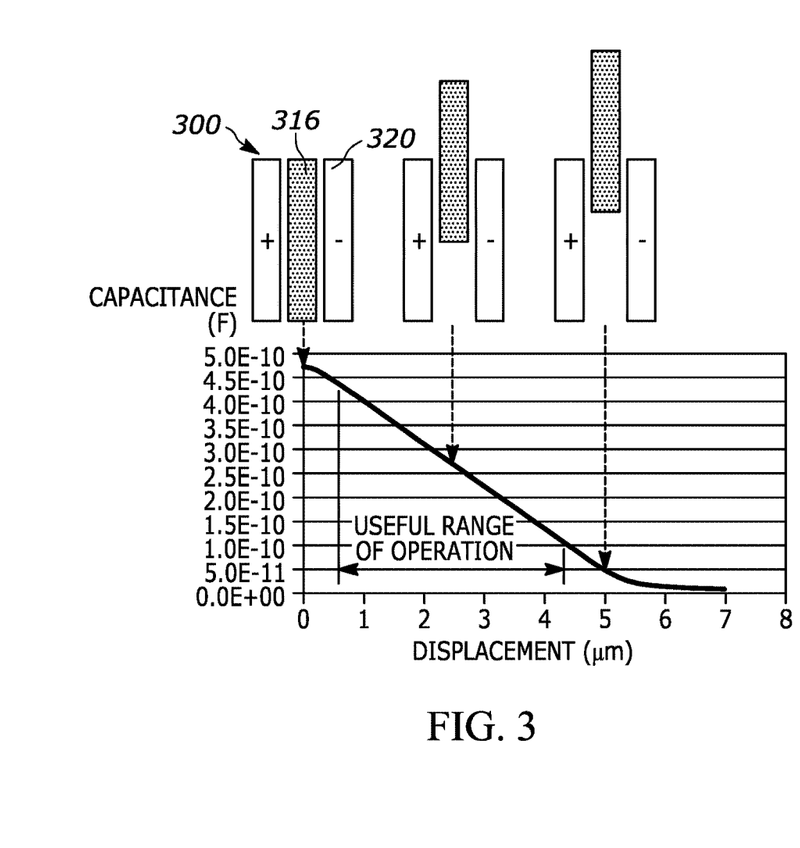
FIG. 3 is a plot showing the capacitance of an idealized dielectric actuator as a function of the relative position between a pair of electrodes and a dielectric member.
Figure 4:
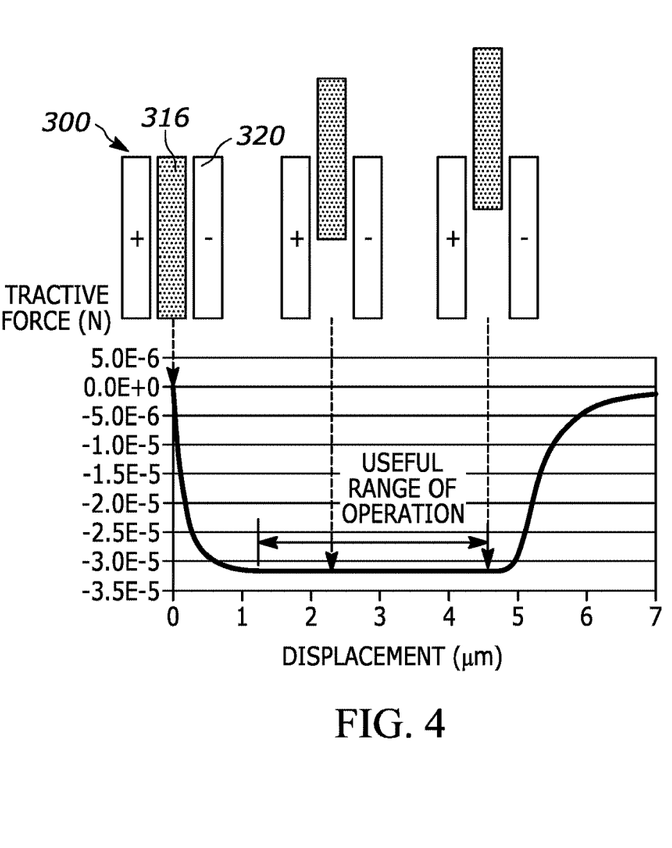
FIG. 4 is plot showing the electrostatic restoration force of the idealized dielectric actuator of FIG. 3 as a function of the relative position between a pair of electrodes and a dielectric member.

FIGS. 3-4 conceptually illustrate the performance of a force feedback actuator 300 that has a similar construction to the force feedback actuator 200 described with reference to FIG. 2. In particular, FIGS. 3-4 illustrate the performance of an ideal force feedback actuator 300 in which the material properties of a dielectric member 316 (e.g., a movable finger) are uniform throughout the dielectric member 316. FIG. 3 shows the change in capacitance of the force feedback actuator as a function of the relative position between the dielectric member 316 and a pair electrodes 320, while FIG. 4 shows the electrostatic restoration force (i.e., tractive force) between the dielectric member 316 and the electrodes 320 over a similar range of positions. The actual position of the dielectric member 316 with respect to the electrodes 320 is shown above each plot, in cross-sectional view through the interdigitated comb structure formed by the movable and stationary fingers (e.g., at a location indicated by line 7-7 in FIG. 2). Notably, these plots show an approximately linear variation in capacitance (FIG. 3) over the useful operating range (e.g., within a range between approximately 0.5 μm and 4.5 μm) of the force feedback actuator, resulting in a nearly constant electrostatic force (FIG. 4).

Figure 5:
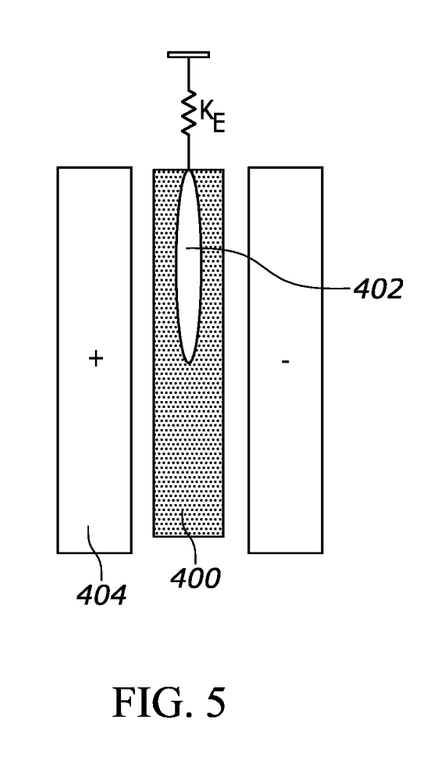
FIG. 5 is a side cross-sectional view of an example dielectric actuator for a MEMS transducer.
Figure 6:
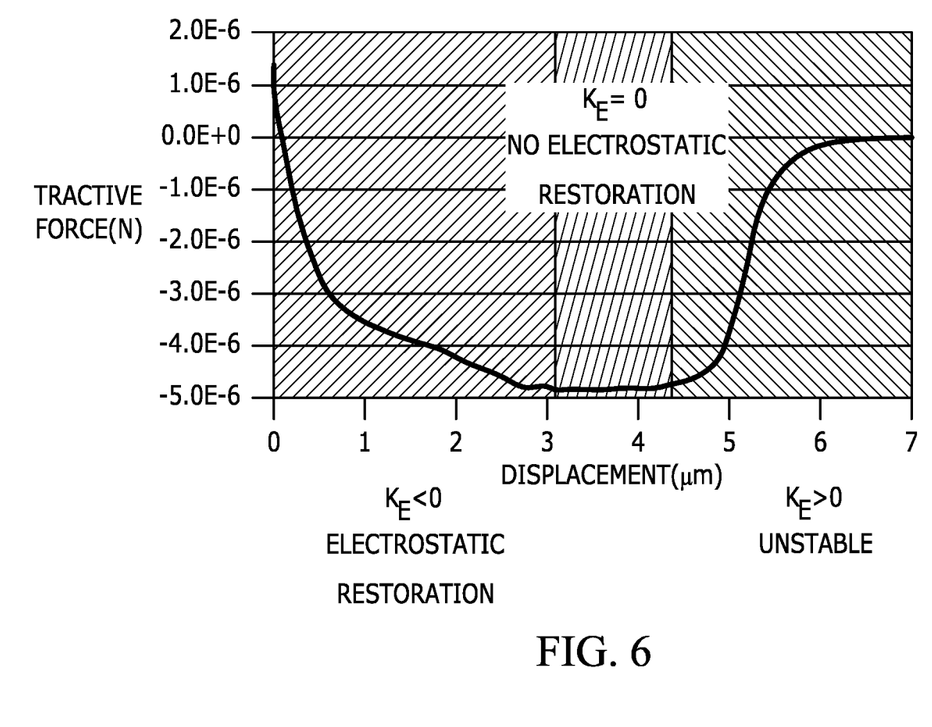
FIG. 6 is a plot of the electrostatic restoration force of the dielectric actuator of FIG. 5 as a function of the relative position between a pair of electrodes and a dielectric member.

The performance characteristics of the force feedback actuator will differ somewhat from the ideal relationships shown in FIGS. 3-4. In particular, imperfections such as voids in the dielectric member, non-uniform material properties, and electrical fringe fields to surroundings will impact the electrostatic force gradient and corresponding sensitivity that can be achieved by the force feedback actuator. Among other possibilities, voids and other imperfections in the dielectric member result from the natural build-up of material during fabrication (e.g., material deposition). FIG. 5 shows an example of how material properties can vary throughout the cross-section of a dielectric member 400 as a result of an internal void 402. As shown in FIG. 6, the void 402 in the dielectric member 400 causes variations in permittivity along the height of the dielectric member 400 (e.g., vertically between an upper and lower surface of the dielectric member 400), which impacts the electrostatic restoration force as the dielectric member 400 moves relative to the electrodes 404. This variation is shown as a gradient in the electrostatic force between approximately 0.5 μm and 2.75 μm in FIG. 6. The electrostatic force gradient shown in FIG. 6 will vary depending on the shape of the void 402 and the depth that the void 402 extends into the dielectric member 400.

Figure 7A:
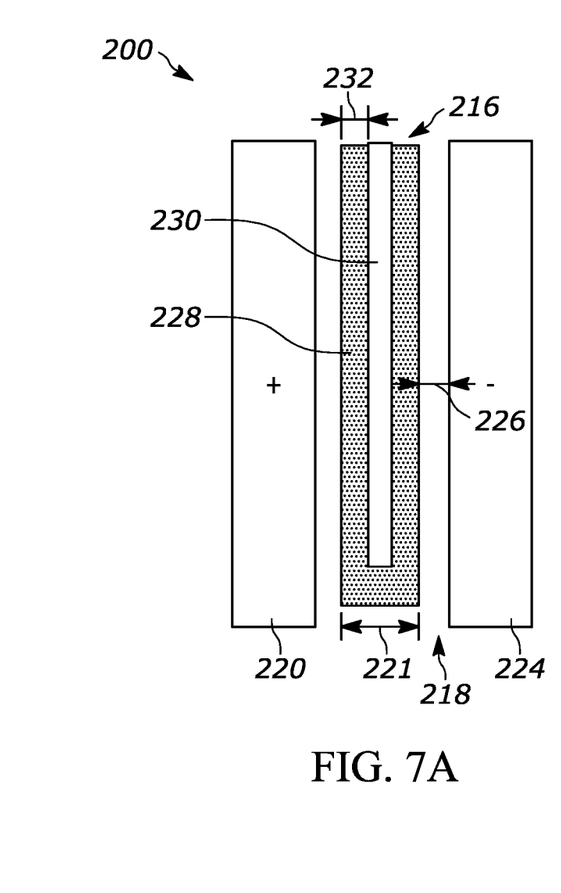
FIG. 7A is a side cross-sectional view of a dielectric actuator of the MEMS transducer of FIG. 2 taken at line 7-7.

FIG. 7A shows a cross-sectional view through the movable (e.g., dielectric members) and stationary fingers (e.g., electrodes) of the force feedback actuator 200 of FIG. 2. Specifically, FIG. 7A shows a cross-section through one pair of electrodes (e.g., first electrode 220 and a second electrode 224) and a dielectric member 216. A height of the dielectric member 216 between an upper surface and a lower surface of the dielectric member 216 is within a range between approximately 3 μm and 10 μm. An overall width 221 of the dielectric member 216, in a lateral direction between the pair of electrodes, is within a range between approximately 1 μm and 300 μm. In other embodiments, the overall dimensions of the dielectric member 216 may be different. As shown in FIG. 7A, the pair of electrodes is spaced apart from one another to form a gap 218. The dielectric member 216 is disposed at a central position within the gap 218 between the pair of electrodes. A width of the dielectric member 216 is less than a width of the gap 218 such that the dielectric member 216 is spaced apart from both the first electrode 220 and the second electrode 224. In some implementations, a width 226 of the gap 218 between the dielectric member 216 and at least one of the first electrode 220 and the second electrode 224 is within a range between approximately 100 nm and 300 nm. In other embodiments, the spacing between the dielectric member 216 and the electrodes 220, 224 may be different.

The dielectric member 216 includes a dielectric gradient in at least two directions through the dielectric member 216. As referred to herein, a dielectric gradient refers to a change in material properties and/or permittivity along the dielectric member 216 in a given direction. The dielectric gradient may be created through the use of secondary materials and/or by forming air pockets into the dielectric member 216 via an etching process. In particular, the dielectric member 216 includes a plurality of dielectric materials (e.g., portions) that are stacked or otherwise arranged along the lateral direction between the pair of electrodes. In other words, the dielectric member 216 includes a controlled dielectric gradient characterized by a discrete change in relative permittivity (e.g., the discrete change associated with the change in material properties between the first and second dielectric materials) normal to the direction of relative movement between the dielectric member 216 and the pair of electrodes (e.g., in a horizontal direction as shown in FIG. 7A, in a lateral direction between fingers, etc.). The dielectric member 216 also includes a controlled dielectric gradient along the direction of relative movement between the dielectric member 216 and the pair of electrodes due to the change in material properties near a lower end of the dielectric member 216.

Figure 7B:
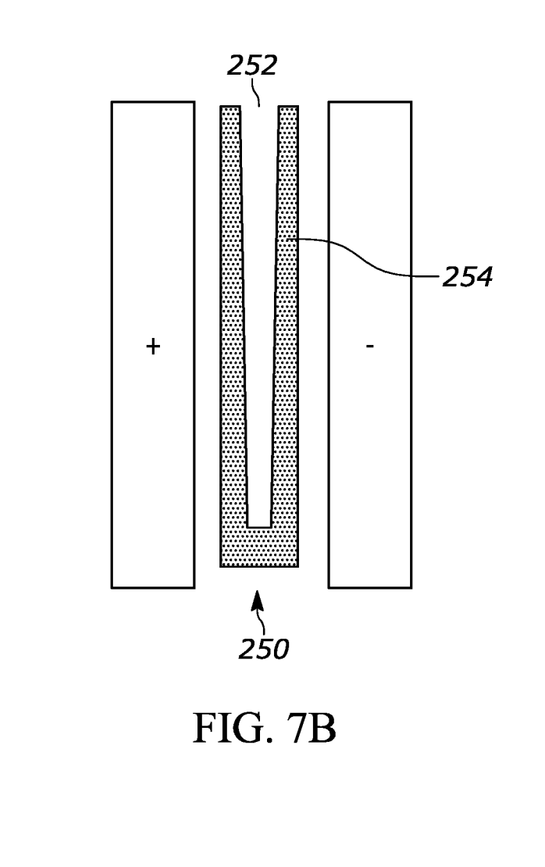
FIG. 7B is a side cross-sectional view of another example of a dielectric actuator.

As shown in FIG. 7A, the dielectric member 216 includes a first portion, shown as first dielectric material 228 and a second portion, shown as second dielectric material 230 disposed at least partially within the first dielectric material 228. In other embodiments, as shown in FIG. 7B, the dielectric gradient in the dielectric member 250 is provided by an air pocket 252 etched into the first dielectric material 254 (e.g., an air pocket in place of the second dielectric material 230 shown in FIG. 7A, an air pocket within the second dielectric material 230, etc.). In some implementations, the air pocket 252 may be etched into the first dielectric material 254 in substantially the same shape as the second dielectric material 228 shown in FIG. 7A or in another suitable shape to reduce the gradient in electrostatic force over the operating range of the force feedback transducer 200. In the embodiment of FIG. 7B, the air pocket 252 is etched into the first dielectric material 254 at a taper such that a width of the air pocket 252 is greater near the upper end of the dielectric member 250 than the lower end.

As shown in FIG. 7A, the second dielectric material 230 is disposed centrally within the first dielectric material 228, such that the second dielectric material 230 is surrounded on at least three sides by the first dielectric material 228. The second dielectric material 230 extends downwardly into the first dielectric material 228 along a majority of the height of the dielectric member 216. As shown in FIG. 7A, a thickness 232 of the first dielectric material 228 is approximately uniform along a perimeter of the second dielectric material 230. In some implementations, the thickness 232 of the first dielectric material 228 is within a range between approximately 100 nm and 300 nm, and/or approximately the same as the width 226 of the gap 218 between the first dielectric material 228 and each one of the first electrode 220 and the second electrode 224. Notably, the shape of the second dielectric material 230 is approximately uniform through the depth of the dielectric member 216, resulting in a discrete change in permittivity normal to the direction of relative movement between the dielectric member 216 and the pair of electrodes. In the embodiment shown in FIG. 7A, the second dielectric material 230 has a rectangular shape when viewed in cross-section. In other embodiments, the shape of the second dielectric material 230 may be different. For example, the lower corners of the rectangle shown in FIG. 8 may be rounded. The inner sidewalls of the first dielectric material 228, where the second dielectric material 230 engages with the first dielectric material 228, may be tapered at an angle (e.g., 5°, etc.) or another angle based on manufacturing constrains and/or the desired performance of the force feedback actuator 200. For example, the second dielectric material 230 may take the place of the air pocket 252 shown in FIG. 7B (e.g., the second dielectric material 230 may be deposited or otherwise formed into the air pocket 252 shown in FIG. 7B such that the width of the second dielectric material 230 is greater near an upper end of the dielectric member than the lower end). In other words, the second dielectric material 230 may at least partially form a V-shape where it engages with the first dielectric material 228 (e.g., at the interface between the first dielectric material 228 and the second dielectric material 230). The taper results in a continuous change in permittivity along the height of the second dielectric material 228.

The material properties of the first dielectric material 228 and the second dielectric material 230 are selected to minimize the variation in permittivity across the dielectric member 216. In the embodiment of FIG. 7A, the first dielectric material 228 is made from a silicon nitride material and the second dielectric material 230 is made from a polycrystalline silicon material. The combination of materials, and the relative thicknesses of each material layer may be adjusted to obtain the desired material properties of the dielectric member 216 (e.g., an average permittivity across the dielectric member 216, etc.). Among other benefits, the polycrystalline silicon material may be deposited at a lower pressure than silicon nitride, which reduces the risk of forming internal voids during fabrication. The outer silicon nitride ensures sufficient mechanical strength of the dielectric member 216 under loading.

Figure 8:
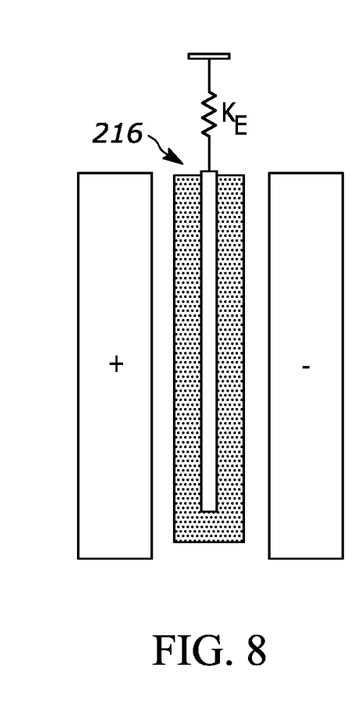
FIG. 8 is a schematic representation of the electrostatic restoration force acting upon the dielectric actuator of FIG. 7.
Figure 9:
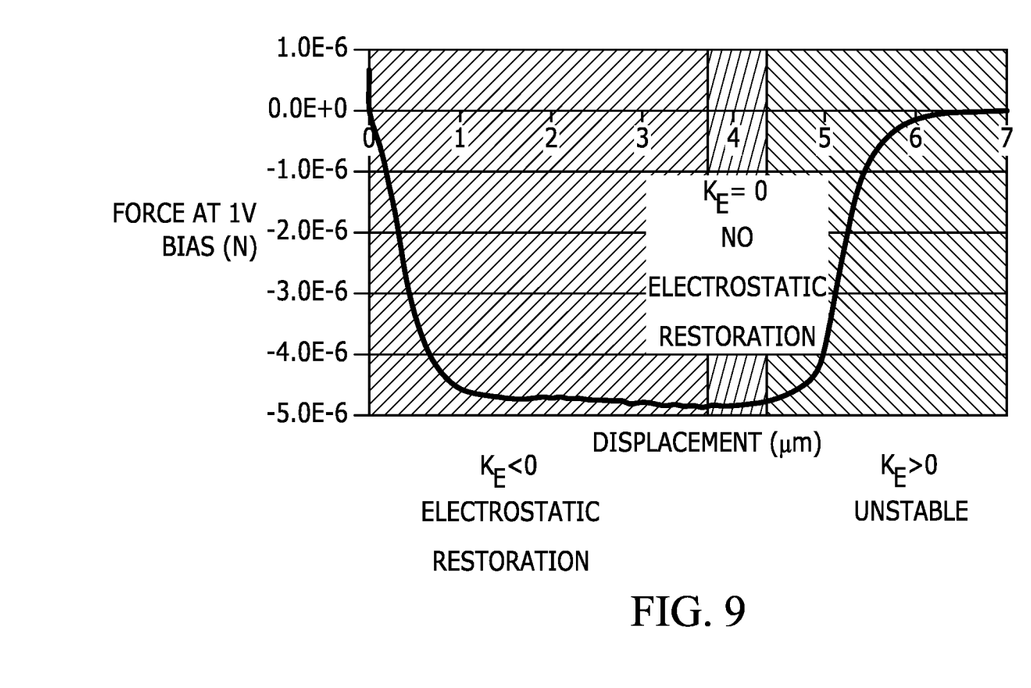
FIG. 9 is a plot of the electrostatic restoration force of the dielectric actuator of FIG. 8 as a function of the relative position between a pair of electrodes and a dielectric member.

FIGS. 8-9 show the improvements in the electrostatic force gradient that can be achieved by using a dielectric member 216 with a controlled dielectric gradient (e.g., multiple portions, each having a different permittivity). Unlike the large change (e.g., gradient) in electrostatic force observed in FIG. 6, the dielectric member 216 shown in FIG. 7A and FIG. 8 exhibits a nearly constant (e.g. flat) electrostatic restoration force as a function of position over a large operating range (e.g., between approximately 0.5 μm and 4.5 μm).

Figure 10:
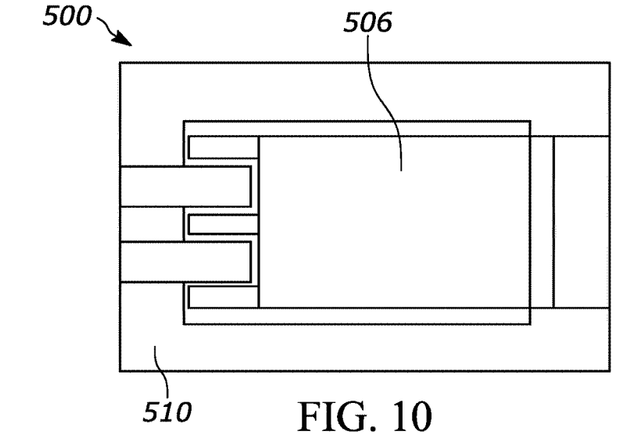
FIG. 10 is a top view of an example MEMS transducer.
Figure 11:
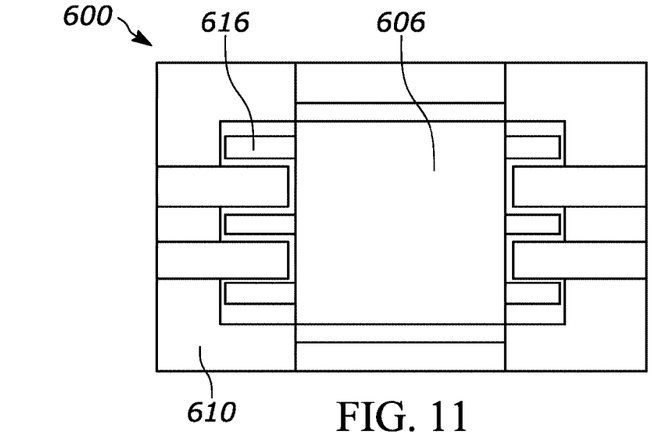
FIG. 11 is a top view of another example MEMS transducer.

It will be appreciated that design of the dielectric member 216 may be utilized in a variety of alternative force feedback actuator constructions. For example, FIG. 10 shows a force feedback actuator 500 that is similar to the force feedback actuator 200 of FIG. 2. Again, the movable and stationary fingers form an interdigitated comb structure that is disposed on a single side (e.g., left side as shown in FIG. 10) of a cantilever diaphragm 506. The opposite end of the cantilever diaphragm 506 is secured to the transducer substrate 510 by a diaphragm anchor, which may include a silicon oxide layer deposited above or below the cantilever diaphragm 506. FIG. 11 shows a force feedback actuator 600 that includes an interdigitated comb structure on two sides of a movable diaphragm 606. The diaphragm 606 is coupled to a transducer substrate 610 (e.g., base) at both an upper side of the transducer substrate 610 and a lower side opposite the upper side. The diaphragm 606 includes movable fingers 616 on either side of the diaphragm 606 (e.g., a left side and a right side as shown in FIG. 11) that extend outwardly away from the diaphragm 606 in a direction that is parallel to the diaphragm (e.g., parallel to an upper surface of the transducer substrate 610).

Figure 12:
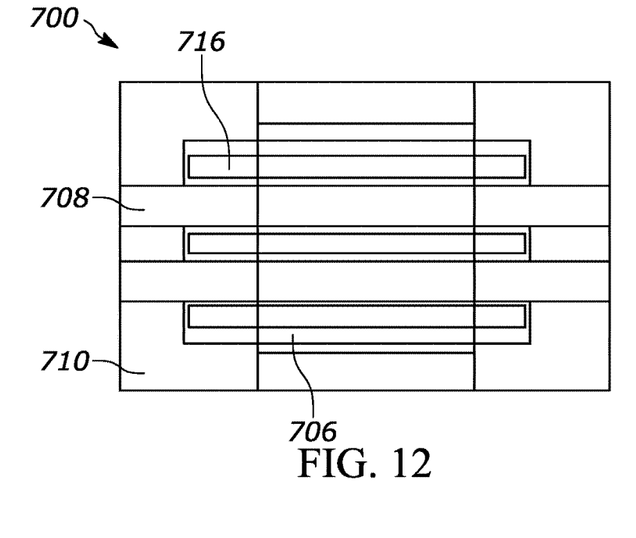
FIG. 12 is a top view of another example MEMS transducer.

FIG. 12 shows another example force feedback actuator 700. The force feedback actuator 700 includes a diaphragm 706, which is constructed in a similar fashion to the diaphragm 606 of FIG. 11. However, unlike FIG. 11, the movable fingers 716 shown in the actuator 700 of FIG. 12 extend downwardly from the diaphragm 706 in substantially perpendicular orientation relative to the diaphragm 706 (e.g., parallel to an axis of the central opening defined by the transducer substrate 710). The stationary fingers 708 are disposed below the diaphragm 706 and are coupled to the transducer substrate 710 on two ends such that the stationary fingers 708 extend across the central opening. The movable fingers 716 extend into gaps formed between adjacent ones of the stationary fingers 708. As such, the stationary fingers 708 and the movable fingers 216 may be at least partially disposed within the central opening. In operation, the movable fingers 216 move in and out of the central opening in a direction parallel to the axis of the central opening (in and out of the page as shown in FIG. 12).

Figure 13:
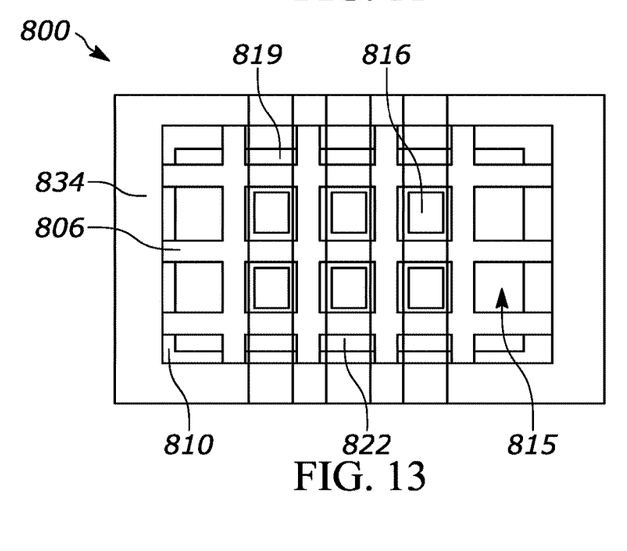
FIG. 13 is a top view of another example MEMS transducer.

FIG. 13 shows yet another implementation of a force feedback actuator 800. The force feedback actuator 800 includes a plurality of pillars 816 that extend parallel to an axis of the central opening. The pillars 816 are supported within the central opening by metal interconnects 819, 822 that are coupled at either end to the transducer substrate. The diaphragm 806 is a waffle structure that includes a plurality of openings 815. Each of the openings 815 is configured to receive a corresponding one of the pillars 816 therein. The outer ends of the diaphragm 806 are disposed in trenches that are formed into an upper surface of the transducer substrate 810. The force feedback actuator 800 additionally includes a diaphragm anchor 834 configured to support the ends of the diaphragm 806 and to prevent the diaphragm 806 from separating from the transducer substrate 810 during normal operation. The number and geometry of the stationary and movable fingers shown in FIGS. 10-13 may be different in various exemplary embodiments.

Figure 14:
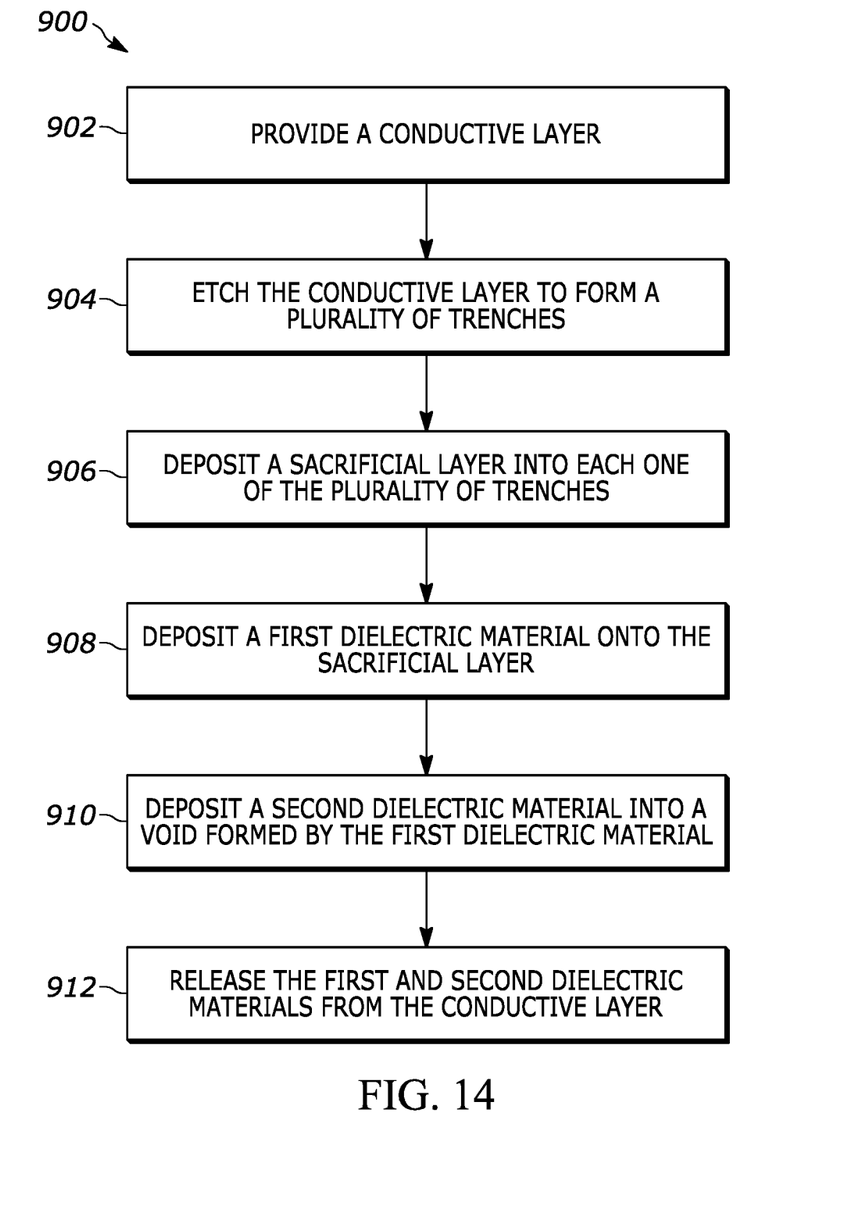
FIG. 14 is a flow diagram of an example method of making a dielectric actuator for a MEMS transducer.
Figure 15:
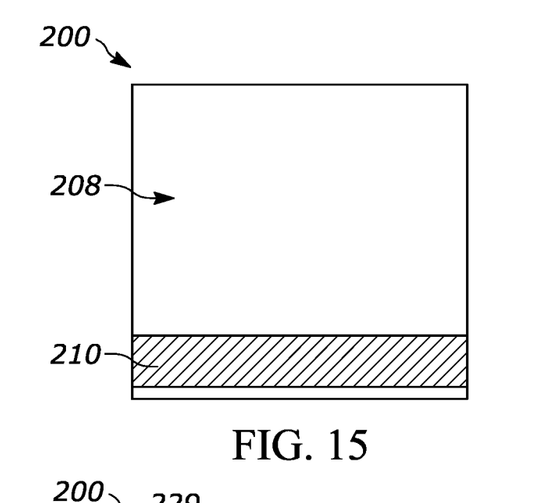
FIG. 15 is a side cross-sectional view of an electrode material deposited onto an insulating layer.
Figure 16:
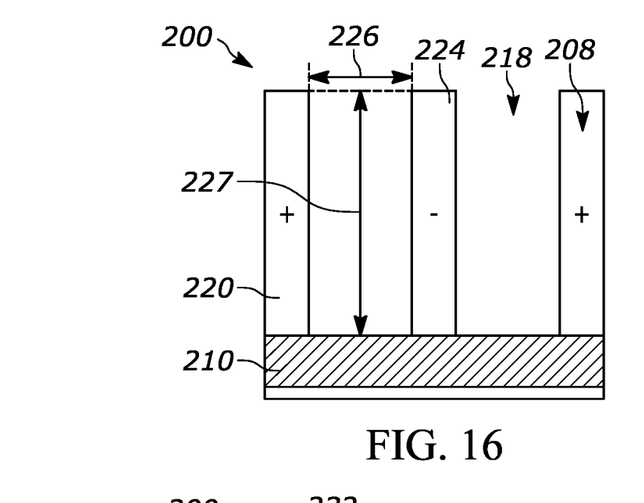
FIG. 16 is a side cross-sectional view of the electrode material of FIG. 15 after an etching operation.
Figure 17:
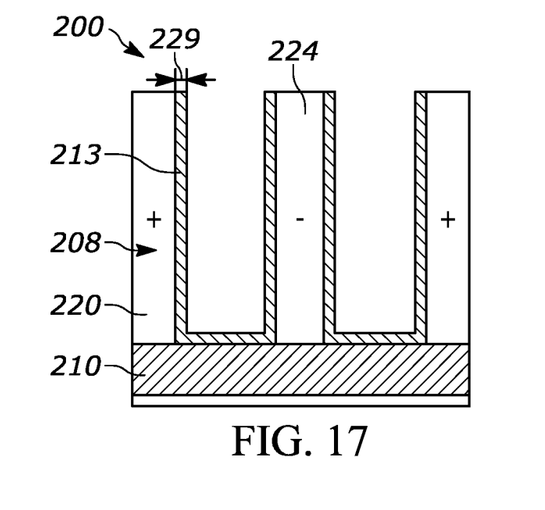
FIG. 17 is a side cross-sectional view of the electrode material of FIG. 15 after depositing a sacrificial material.
Figure 18:
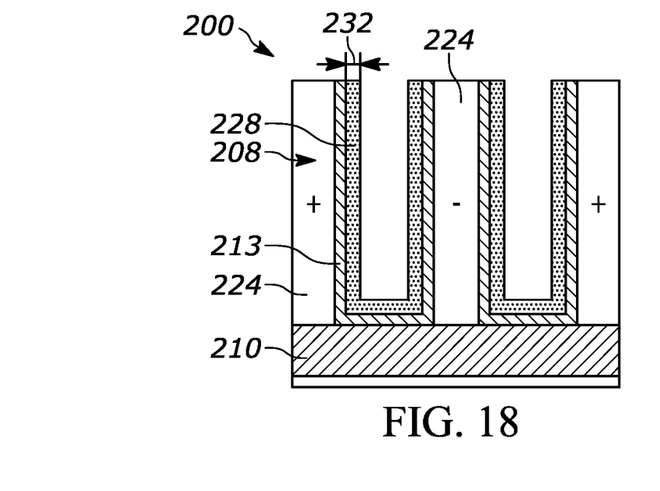
FIG. 18 is a side cross-sectional view of the electrode material of FIG. 15 after depositing a first dielectric material.

FIG. 14 shows a flow diagram of a method 900 of making a force feedback actuator for a MEMS transducer, according to an illustrative embodiment. Method 900 may be implemented with the force feedback actuator 200 of FIGS. 1-2. Accordingly, method 900 may be described with regards to FIGS. 1-2. Additionally, various steps of the method 900 are illustrated conceptually in FIGS. 15-20, which show the various steps in a cross-sectional view through the movable and stationary fingers of the force feedback actuator (see lines 7-7 of FIG. 2).

At 902, a polycrystalline silicon layer (e.g., stationary fingers 208) is provided. The polycrystalline silicon layer may be deposited or otherwise formed onto an insulating layer of silicon nitride (e.g., transducer substrate or base 210). At 904, the polycrystalline silicon layer is etched to form a plurality of trenches (e.g., gaps 218) into the polycrystalline silicon layer. The trenches extend through the thickness of the polysilicon layer forming a plurality of fingers that are electrically isolated from one another by the insulating layer. In the implementation shown in FIG. 16, a width 226 of each trench is approximately 1.4 μm and a depth 227 of each trench is approximately 5 μm. In other implementations, the trench dimensions may be different.

At 906, a sacrificial layer (e.g., oxide layer 213) is deposited along the inner walls of each one of the trenches, along the outer surface of the polysilicon layers and the insulating layers. A thickness 229 of the sacrificial layer is approximately 200 nm, although the thickness 229 may be different depending on the design parameters of the force feedback actuator. At 908, a first dielectric material (e.g., silicon nitride, first dielectric material 228) is deposited on top of the sacrificial layer (see FIG. 18). Again, the thickness 232 of the first dielectric material may vary depending on design parameters. In the implementation shown in FIG. 18, a thickness 232 of the first dielectric material is approximately 200 nm. The first sacrificial material defines a void or air pocket.

Figure 19:
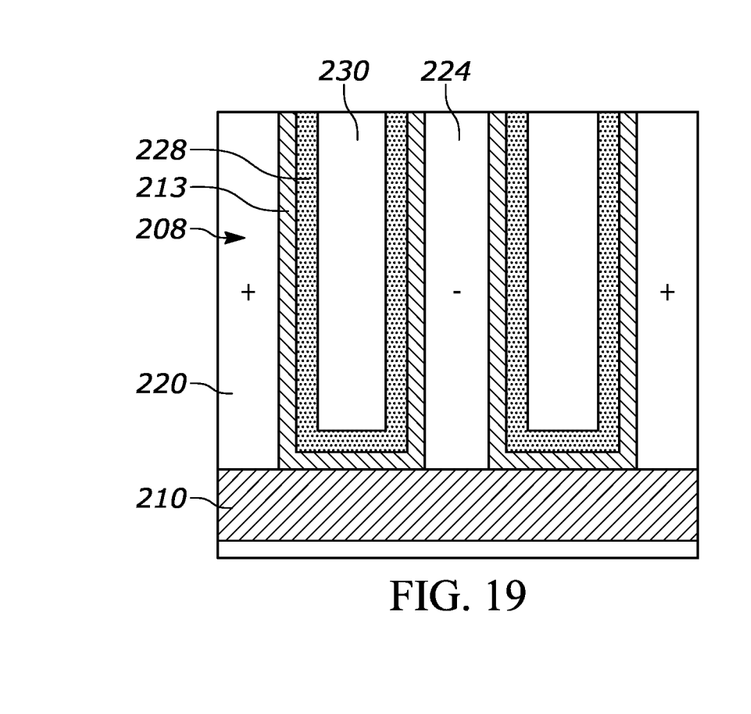
FIG. 19 is a side cross-sectional view of the electrode material of FIG. 15 after depositing a second dielectric material.
Figure 20:
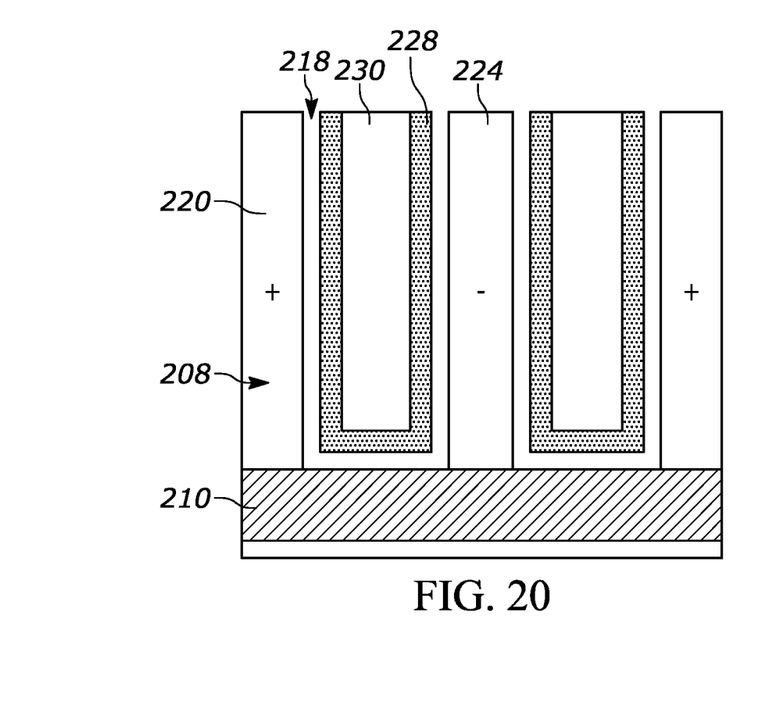
FIG. 20 is a side cross-sectional view of the electrode material of FIG. 15 after removing the sacrificial material from between the electrode material and the first dielectric material.

At 910, a second dielectric material (e.g., polycrystalline silicon, second dielectric material 230) is deposited into the void formed by the first dielectric material. Block 910 may include completely filling the void with the second dielectric material. Block 910 may additionally include etching away residual layers of the first and second dielectric materials (e.g., planarizing) from the upper surface of first polysilicon layer (e.g., the electrodes 220, 224). At 912, the sacrificial oxide layer is etched away to release the first and second dielectric materials (e.g., the dielectric member 216) from the stationary fingers of polysilicon. In other implementations, the method 900 may include additional, fewer, and/or different operations.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A force feedback actuator, comprising:
   a pair of electrodes spaced apart from one another to form a gap; and
   a dielectric member disposed at least partially within the gap, the dielectric member comprising a first portion having a first permittivity and a second portion having a second permittivity, the dielectric member and the pair of electrodes are configured for movement relative to each other.

2. The force feedback actuator of claim 1, wherein the second portion is disposed at least partially within the first portion.

3. The force feedback actuator of claim 1, wherein the permittivity of the dielectric member changes in a direction normal to or along a direction of relative movement between the dielectric member and the pair of electrodes.

4. The force feedback actuator of claim 1, wherein the pair of electrodes is one of a plurality of pairs arranged in a comb shape, and wherein the dielectric member is one of a plurality of dielectric members interposed between the pair of electrodes of the plurality of pairs.

5. The force feedback actuator of claim 1, wherein the first portion is made from a silicon nitride material, and wherein the second portion is made from a polycrystalline silicon material.

6. The force feedback actuator of claim 1, wherein the second portion is surrounded by the first portion on at least three sides when viewed in cross section through the pair of electrodes and the dielectric member.

7. The force feedback actuator of claim 1, wherein a height of the dielectric member is within a range between approximately 3 μm and 10 μm.

8. The force feedback actuator of claim 1, wherein a width of the dielectric member is within a range between approximately 1 μm and 3 μm.

9. The force feedback actuator of claim 1, wherein a thickness of the first portion is within a range between approximately 100 nm and 300 nm.

10. The force feedback actuator of claim 1, wherein a width of the gap between the first portion and one of the pair of electrodes is within a range between approximately 100 nm and 300 nm.

11. The force feedback actuator of claim 1, wherein the force feedback actuator forms part of a microelectromechanical systems (MEMS) transducer.

12. A microelectromechanical systems (MEMS) capacitive transducer comprising:
   a chamber;
   a first electrode disposed in the chamber;
   a second electrode disposed in the chamber and spaced apart from the first electrode, the first electrode electrically isolated from the second electrode;
   a dielectric member disposed in the chamber, the dielectric member located at least partially between the first and second electrodes depending on a degree of relative movement between the dielectric member and the first and second electrodes, the dielectric member comprising a first portion having a first permittivity and a second portion having a second permittivity.

13. The transducer of claim 12, wherein, when an electric field is applied between the first and second electrodes, the dielectric member provides a relatively constant restorative electrostatic force over a greater range of relative movement between the dielectric member and the first and second electrodes than a dielectric member without portions having different permittivity.

14. The transducer of claim 12, wherein an electric field applied between the first and second electrodes provides a restorative electrostatic force that counteracts relative movement between the dielectric member and the first and second electrodes caused by a mechanical force.

15. The transducer of claim 12, wherein the permittivity of the dielectric member is characterized by a discrete change in permittivity between the first portion and the second portion normal to or along a direction of relative movement between the dielectric member and the first and second electrodes.

16. The transducer of claim 12, wherein the first portion of the dielectric member is silicon nitride and the second portion of the dielectric member is polycrystalline silicon.

17. The transducer of claim 12, wherein the dielectric member has a different permittivity normal to or along a direction of relative movement between the dielectric member and the first and second electrodes.

18. The transducer of claim 12, the chamber at least partially evacuated, and either the dielectric member or the first and second electrodes is coupled to a member outside the chamber, wherein a mechanical force applied to the member outside the chamber causes the relative movement between the dielectric member and the first and second electrodes.

19. The force feedback actuator of claim 1,
wherein the pair of electrodes comprise a first electrode and a second electrode, and
wherein the first electrode is electrically isolated from the second electrode.

20. The force feedback actuator of claim 1,
wherein the first portion comprises a first dielectric portion and the second portion comprises a second dielectric portion, and
wherein the first permittivity is a controlled permittivity different from a controlled permittivity of the second permittivity.

21. The force feedback actuator of claim 1, wherein the pair of electrodes are fixed in relation to each other.

* * * * *